United States Patent
Gerard et al.

(10) Patent No.: US 6,868,103 B2
(45) Date of Patent: Mar. 15, 2005

(54) SINGLE PHOTON SOURCE BASED ON TRANSMITTERS WITH SELECTIVELY DISTRIBUTED FREQUENCIES

(75) Inventors: Jean-Michel Gerard, Chatillon (FR); Bruno Gayral, Paris (FR); Dang Le Si, Montbonnot-St-Martin (FR)

(73) Assignees: France Telecom, Paris (FR); Centre National de la Recherche Scientifique, Paris (FR)

(*) Notice: Subject to any disclaimer, the term of this patent is extended or adjusted under 35 U.S.C. 154(b) by 0 days.

(21) Appl. No.: 10/297,101
(22) PCT Filed: May 28, 2001
(86) PCT No.: PCT/FR01/01637
§ 371 (c)(1), (2), (4) Date: Apr. 7, 2003
(87) PCT Pub. No.: WO01/93384
PCT Pub. Date: Dec. 6, 2001

(65) Prior Publication Data
US 2003/0152228 A1 Aug. 14, 2003

(30) Foreign Application Priority Data
May 29, 2000 (FR) .............................. 00 06824

(51) Int. Cl.7 ............................. H01S 3/13; H01L 29/06
(52) U.S. Cl. ............................. 372/32; 372/109; 257/9; 257/14
(58) Field of Search ........................... 372/32, 109, 43, 372/29.022; 257/9, 14

(56) References Cited

U.S. PATENT DOCUMENTS 5,859,867 A * 1/1999 An et al. ..................... 372/70
6,657,222 B1 * 12/2003 Foden et al. ................. 257/13

OTHER PUBLICATIONS

Jean–Michel Gerard and Bruno Gayral; "Strong Purcell Effect for InAs Quantum Boxes in Three–Dimensional Solid–State Microcavities"; Journal of Lightwave Technology, vol. 17, No. 11, Nov. 1999.*
Gerard J. , et al "Strong Purcell effect for InAs Quantum Boxes in Three–Dimensional Solid–State Microcavities", Journal of Lightwave Technology, Nov. 1999 IEEE, pp. 2089–1095.
Gayral. B., et al "Optical Study of GaAs/A1As pillar microcavities with elliptical cross section", Applied Physics Letters, Mar. 23, 1998, pp. 1421–1423.
D.G. Deppe et al., "Quantum–dot vertical–cavity surface–emitting laser based on the Purcell effect", Applied Physics Letters, American Institute of Physics, Nov. 22, 1999, pp. 3455–3457.
S. Tanaka, "Stimulated emission from optically pumped GaN quantum dots", Applied Physics Letters, Sep. 8, 1997, 2 pages.

* cited by examiner

Primary Examiner—Don Wong
Assistant Examiner—Leith Al-Nazer
(74) Attorney, Agent, or Firm—Blakely Sokoloff Taylor & Zafman

(57) ABSTRACT

Apparatus for single photon source based on emitters with frequencies distributed in a chosen manner. In one embodiment, the apparatus comprises an opto-electronic component capable or emitting light pulses containing a single photon comprising a resonant optical cavity and a group of photon emitters placed in this optical cavity, a single one of these emitters having an emission frequency equal to approximately the resonant frequency of the cavity characterised in that all emitters have a spectral distribution with a concentration of emitter frequencies at a given frequency, and in that the cavity is made so that its resonant frequency is different from this concentration frequency so that the number of emitters with an emission frequency corresponding to the resonant frequency of the cavity is close to one.

12 Claims, 10 Drawing Sheets

(PRIOR ART)

SINGLE PHOTON SOURCE BASED ON TRANSMITTERS WITH SELECTIVELY DISTRIBUTED FREQUENCIES

The present patent application is a non-provisional application of International Application No. PCT/FR01/01637, filed May 28, 2001.

FIELD

The invention relates to opto-electronic components capable of deterministically emitting light pulses containing one and only one photon.

The main applications of this component are in metrology and in secured telecommunications.

BACKGROUND

A "single photon source" is a component or a system capable of generating light pulses containing one and only one photon. A high performance single photon solid source potentially has many important applications, for example in metrology (light flux or energy standard) or in telecommunications, by enabling absolute security of exchanges using quantum cryptography.

Note that in the telecommunications field, the envisaged applications for quantum cryptography mainly concern emission on optical fibres at usual wavelengths (1.3–1.55 µm), but also by telecommunications in free space (Earth—satellite or inter-satellite communications, submarine communications within the blue-green emission window, short distance land communications).

For this application to quantum cryptography, it is essential that pulses output by the source never contain more than one photon to achieve unconditional confidentiality. At the moment, very attenuated laser pulses containing 0.1 photon on average, and which are only very imperfect approximations of single photon pulses, are used for availability reasons.

These sources have been used to validate the compatibility of quantum communication protocols with the existing optical network, but a Poisson distribution of their pulses causes severe limitations for real use; firstly, 90% of pulses do not contain any photons, which severely limits the transmitted data rate; a more severe problem is that security is compromised by the fact that 1% of pulses (about 10% of useful pulses) contain more than one photon.

Therefore, a spy could intercept the entire transmitted sequence, and could analyse and retransmit the pulses containing several photons without errors. The only action taken by this spy would be to reduce the transmitted rate rather than increase the error rate, and it would be impossible to distinguish his action from the presence of optical losses on the line. Therefore it is important to develop a source capable of delivering pulses that never contain more than one photon, with the highest possible probability of containing one photon.

If single atoms in cavities are capable of producing such a source, the sophistication of the experimental system necessary to prepare, store and manipulate these atoms makes it impossible to consider their application on a large scale. Therefore the deployment of quantum cryptography depends on the development of a low cost high performance solid source of single photons.

A single photon source uses a single emitter (atom, ion, molecule, etc.) to guarantee that the system only stores one elementary electrical or optical excitation, and becomes de-excited later by emitting not more than one photon.

The emission of this localized single emitter is naturally omnidirectional; therefore it needs to be placed in an optical microcavity in order to efficiently collect the emitted radiation, and for example to be able to inject it into an optical fibre. The ideal situation is a situation in which the emission is concentrated in a single mode of the cavity, such that all single photons can be prepared in the same quantum state.

In the past, this combination of a single emitter and a monomode microcavity has not been made successfully, since there are a number of problems:

the atoms, ions or molecules are very imperfect emitters. Molecules have a short life, limited by optical tarnishing or "photodarkening"; the radiation efficiency of atoms and ions placed in a solid matrix is frequently low, and it is difficult to control their numbers;

at the moment, there is no genuinely monomode monolithic optical microcavity. In 1987, Yablonovitch proposed to start from an artificial crystal with a prohibited photonic band (that does not support any electromagnetic mode within a given frequency range), and introduce a single electromagnetic mode in the prohibited band in a controlled manner, by introducing an appropriate defect in the crystal. Although genuine progress had been made in 98–99 in the domain of making crystals with a prohibited three-dimensional photonic band, this approach is found to be technologically very difficult to implement.

Several approaches have been proposed to solve one of these problems.

It is tempting to replace the usual atom, ion or molecule emitter by a semiconducting emitter, a quantum well or a quantum box that has a radiation efficiency of close to one, and which might be electrically pumpable.

Yamamoto et al. has thus proposed to use a quantum well as the active medium (1), since the electronic states of a well are not discrete, it is then necessary to inject a single electron-hole pair at a time if it is required to obtain a single photon. This result may be obtained using Coulomb blockage to inject exactly one electron and one hole in the quantum well. However, in this approach it appears very difficult to increase the operating temperature above 0.1 K, which strongly reduces its usefulness. J. M. Gérard and B. Gayral also proposed to use a single semiconducting quantum box as an emitting centre ([2]). The quantum boxes obtained by auto-organized growth have many advantages in this context, when they are compared with the most frequently studied atoms, ions or molecules; these advantages include good stability, radiation efficiency very close to one while the heat emission of carriers is negligible (in other words T<150K for the most frequently used InAs quantum boxes emitting at close to 1 µm) and the possibility of non resonant electrical or optical pumping due to the efficient capture of carriers injected in the barrier.

As for the quantum well, there is apparently nothing to prevent the injection of several electron-hole pairs into the quantum box at a time, and observing the emission of several photons.

It is observed experimentally that these photons are emitted at different wavelengths corresponding to different charge states of the quantum box, due to the strong Coulomb interaction between trapped carriers. Therefore, it is sufficient to spectrally filter the emission from a quantum box to observe the emission of a single photon in a well chosen spectral window, after impulse pumping.

J. M. Gérard and B. Gayral also proposed to use the "Purcell effect" (exaltation of the spontaneous emission rate of an emitter in a cavity), to very preferentially collect photons useful in a given mode.

Note that the usual monolithic microcavities (micro-column, micro-disk, micro-sphere, etc.) support a discrete set of confined optical modes and a continuum of leakage modes.

When a monochromatic emitter is put in resonance with a confined mode of the microcavity, a very strong exaltation of the spontaneous emission of the emitter towards this mode is observed under some conditions. In the case of InAs quantum boxes, the inventors observed an emission towards this single confined mode 17 times faster than towards all leakage modes from the microcavity ([3]). This effect makes it possible to couple of the order of 95% (=17/(17+1)) of photons towards the resonant mode of the microcavity.

The inventors thus recently proposed to make a single photon source by putting a single quantum box (for example made of InGaAs) inside an optical microcavity (for example an GaAs/AlAs micro-column) and resonance with a confined mode of this microcavity (the fundamental mode in this case) as shown diagrammatically in FIG. 1 which represents an GaAs/AlAs micro-column, in other words a set containing a microcavity "$\lambda$" (in other words a microcavity with a thickness equal to one optical wavelength) made of GaAs, sandwiched between two Bragg mirrors, each composed of an alternating stack of quarter wave layers of GaAs and AlAs. An InGaAs quantum box is placed in this cavity, in resonance with the cavity mode. This microcolumn is placed on a GaAs substrate. The diameter of this micro-column is 1 $\mu$m.

This association of a quantum box/microcavity can simultaneously achieve the emission of single photons and highly preferential coupling with a given mode, according to the operating method described herein.

Impulse optical pumping of the GaAs barrier is achieved; the photogenerated carriers are very quickly captured by the quantum box (or by the free surfaces of the column). The power of the pump is adjusted so as to inject on average of the order of five electron-hole pairs per pulse into the quantum box, such that the probability of having at least one electron-hole pair in the quantum box is very close to 1.

After recombining the excess pairs, with emission of photons at energies shifted from the cavity mode by the Coulomb interaction between carriers, there is still one pair in the quantum box which is then in resonance with the mode.

Due to the Purcell effect, this final photon is emitted very preferentially in the fundamental mode of the micro-column. Therefore, the system proposed here ideally acts like a converter of Poisson pulses from a pump into a stream of single photon pulses. This converter may be integrated vertically and monolithically with an emission laser through the surface in order to form a micro-source of electrically pumped single photons. An operating temperature equal to at least 77K can be obtained.

It is difficult to isolate a single box in a microcavity. Auto-organized growth techniques usually lead to the manufacture of dense quantum box assemblies (typically 400 boxes per $\mu$m$^2$ for InAs/GaAs). The size of these quantum boxes fluctuates; each box has a spectrally very fine emission ray, but their emission wavelength is distributed at random over a wide spectral range (30 to 100 meV in the case of InAs boxes in GaAs). A typical microcavity has a section of a few $\mu$m$^2$, and therefore contains of the order of 1 000 quantum boxes; at the centre of the distribution, there will be of the order of 10 quantum boxes in the cavity for a spectral range of 1 meV. Therefore it is necessary to strongly reduce the number of quantum boxes in the cavity if it is important to be sure that there is a single box in resonance with the useful mode. Several solutions are then possible:

a technological approach could be used to reduce the number of boxes (for example the plane of the boxes could be structured before defining the microcavity); all imaginable approaches of this type are very cumbersome, and tend to degrade the quality of the optical microcavity;

in 1999 (ref. [5]), it was proposed to start from a very sparse boxes plane (about 10 boxes per $\mu$m$^2$). Spectrally, there is then typically one quantum box every 5 meV, and the probability of observing two quantum boxes with the same emission wavelength is very low. The temperature can then be adjusted (of the order of 20K in practice) so as to modify the emission energy of the quantum box closest to the mode, and bring it into resonance. In one variant, the same effect can be achieved by applying a magnetic field. This approach imposes working within a very narrow range of growth parameters for the quantum boxes plane, in order to obtain a low density. For example, in the case of the InAs/GaAs system, the quantity of InAs deposited must be controlled to within less than 0.03 nm, which may be impossible to achieve. In practice, the quantity of InAs at the surface of epitaxied samples must be varied gradually in order to find a useful area in which the surface density of quantum boxes is sufficiently small. Characterisation and tests of structures become much more difficult, and the efficiency of a manufacturing process based on this approach will be very low.

It has also been proposed to place one or several quantum boxes in a microcavity to make lasers with a very low threshold current (4). This known structure is very similar to another known structure consisting of surface emission lasers with quantum boxes.

SUMMARY

The purpose of this invention is to propose a solid photon source structure that can be made more simply.

This invention can achieve good manufacturing efficiency for these sources, and lower their manufacturing cost so that they can be marketed.

This purpose is achieved according to the invention by means of an opto-electronic component capable of emitting light pulses containing a single photon comprising a resonant optical cavity and a group of photon emitters placed in this optical cavity, a single one of these emitters having an emission frequency equal to approximately the resonant frequency of the cavity, characterised in that all emitters have a spectral distribution with a concentration of emitter frequencies at a given frequency, and in that the cavity is made so that its resonant frequency is different from this concentration frequency so that the number of emitters with an emission frequency corresponding to the resonant frequency of the cavity is close to one.

BRIEF DESCRIPTION OF THE DRAWINGS

Other purposes, characteristics and advantages of the invention will become clear after reading the following detailed description with reference to the appended figures in which.

DETAILED DESCRIPTION

Figure 4:
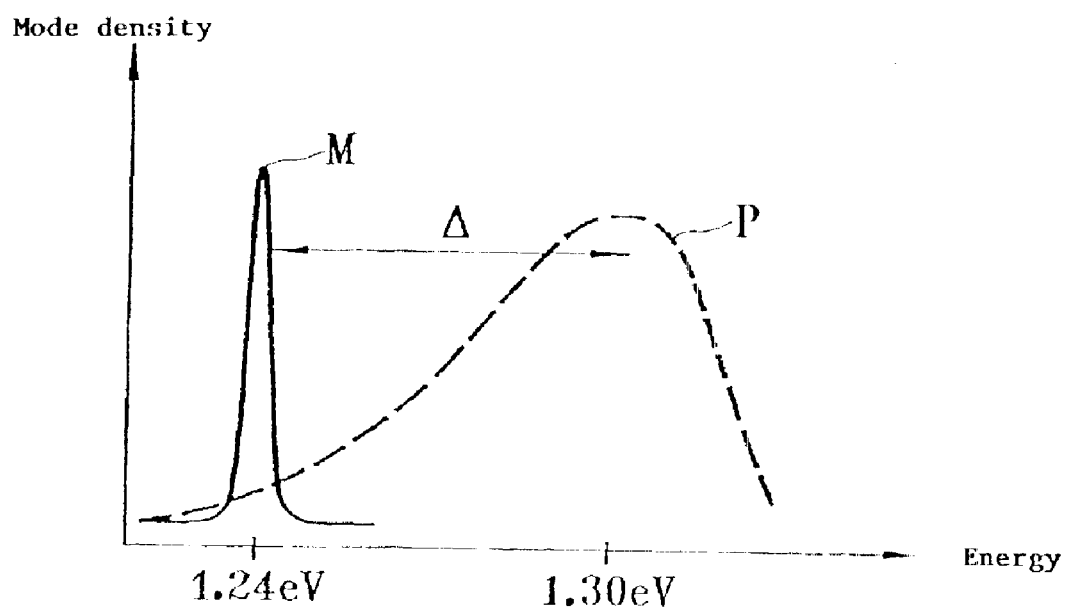
FIG. 4 is a plot showing a spectral distribution of emission frequencies of emitters and a fundamental resonant mode of the cavity in the case of the source in FIG. 3.
Figure 5:
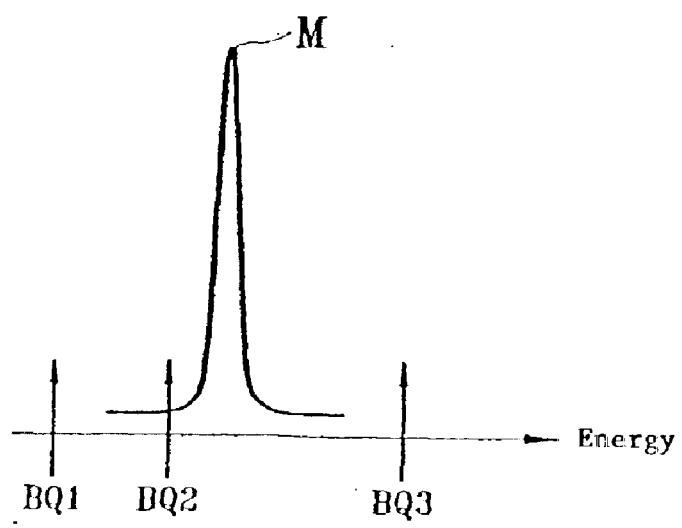
FIG. 5 is a plot partially showing the spectral distribution of emission frequencies of emitters in FIGS. 3 and 4 with respect to the cavity mode of the source.

Characteristically, the invention comprises a three-dimensional optical microcavity 100 in which one or several planes 200 of high density (>100 boxes per µm$^2$) quantum boxes 250 are inserted such that there is a strong spectral shift A between the useful mode (fundamental mode) of the cavity 100 and the maximum emission peak of all quantum boxes 250 namely the concentration point of emission peaks of quantum boxes 250. This peak or concentration point is marked as reference P in FIG. 4. The fundamental mode of the cavity is marked M. This spectral shift Δ is adjusted such that the spectral density of quantum boxes 250 with mode M energy is less than 0.5/ΔE, where ΔE is the spectral width of mode M of the cavity 100.

This shift is easily and very reproducibly obtained by auto-organized epitaxial growth of quantum box planes 250 with a high box density.

The density and the mean emission wavelength of these planes do not critically depend on the quantity of InAs deposited, and are very uniform over the surface of the sample.

The introduction of a strong spectral shift A between the mean emission peak P of the boxes 200 and the useful mode of the cavity 100 on the different devices made can reduce the number of boxes 250 coupled to mode M to an average of 0.5 (or less) quantum boxes on all devices made. A single quantum box can then be put into resonance with this mode by adjusting the temperature.

Similarly, this type of resonance can be set up by applying a magnetic field with a selected value to the structure.

This mean peak or the global emission ray of the plane of boxes 250 may be placed on the "high energies" side or the "low energies" side of the cavity mode M. However, it is preferable to place it on the "high energies" side of mode M in order to avoid collecting the emission originating from transitions between excited states of quantum boxes 250.

For some families of materials such as InAs/GaAs, the spectral distribution of quantum boxes 250 can be described by a Gaussian description as a very good approximation; it is then easy to calculate the difference Δ between mean peak P/mode M.

Δ can always be adjusted experimentally if this distribution is not as well known or if it is not as regular.

We will now describe a few example embodiments in detail.

Figure 1:
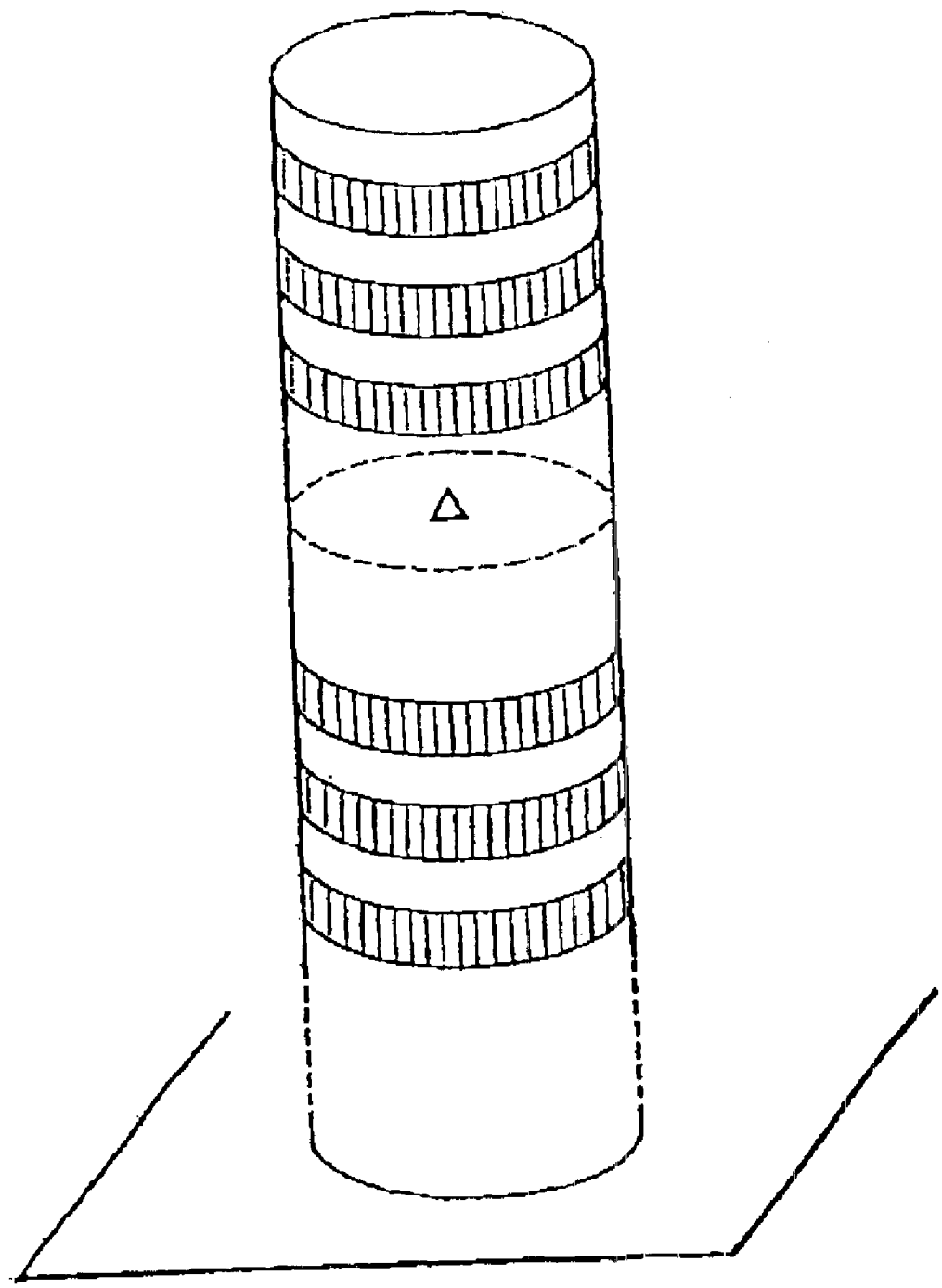
FIG. 1 shows a single photon source comprising a single emitter according to prior art.
Figure 2:
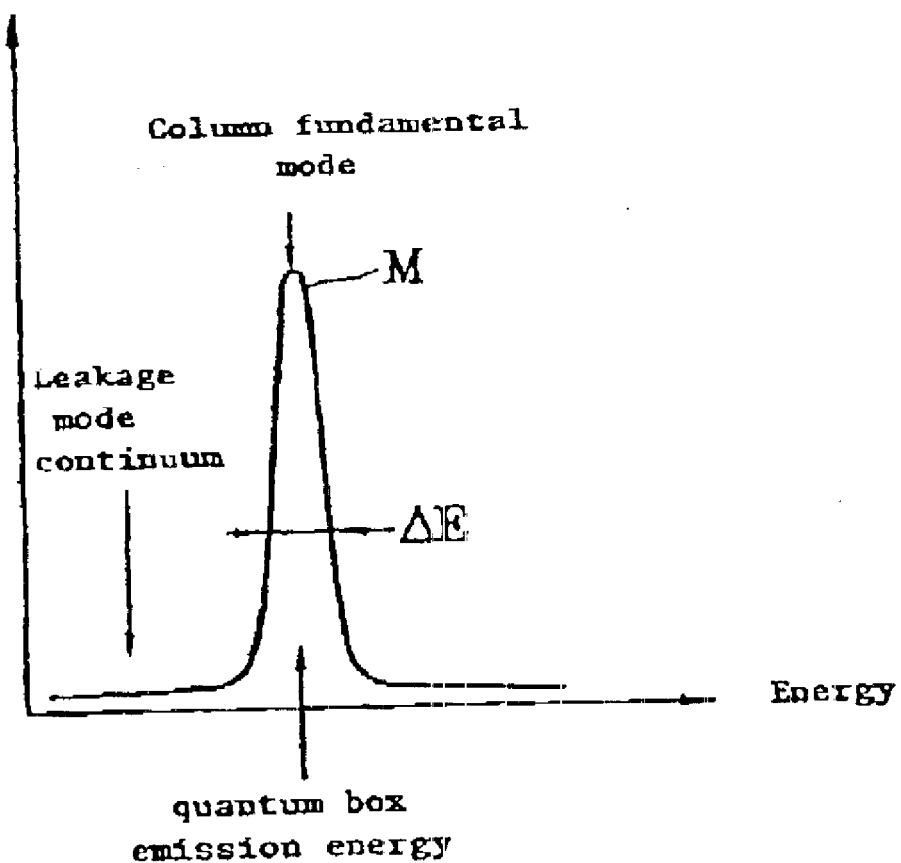
FIG. 2 is a plot showing the density of cavity modes for the source in FIG. 1.
Figure 3:
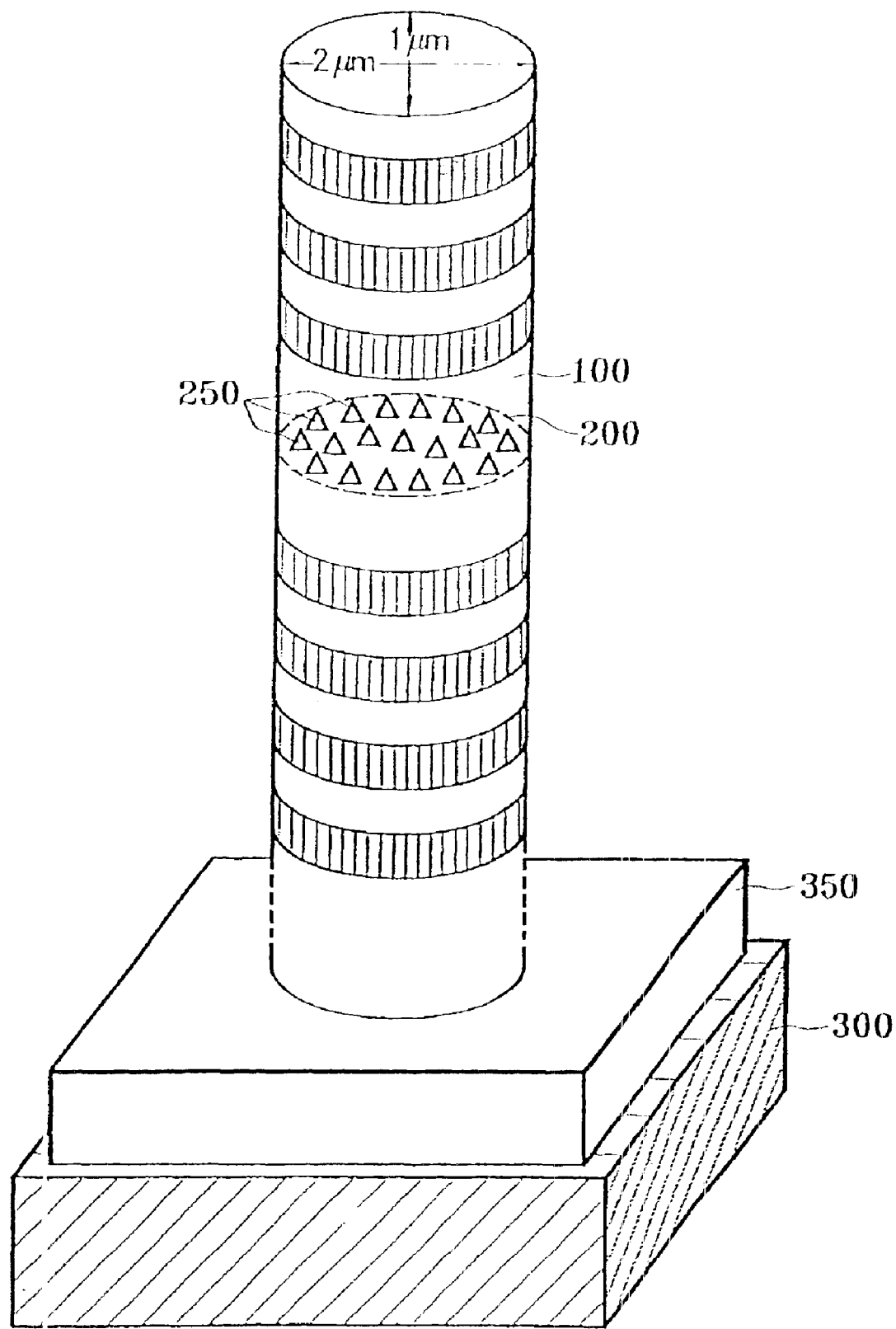
FIG. 3 shows a micro-column source with several emitters according to the invention.

In the example shown in FIG. 3, the microcavity 100 is in the form of a cylindrical column with an elliptical section.

FIG. 3 shows a structure conform with the invention, operating at a wavelength of 1 µm, using a GaAS/AlAs micro-column and InGaAs quantum boxes.

More precisely, the cavity is sandwiched between two Bragg mirrors each of which is composed of an alternating series of GaAs and AlAs quarter wavelength layers.

The eccentricity of the section is sufficient such that the fundamental mode of this cavity is not degenerated (6) (for example small axis 1 µm, large axis 2 µm).

During growth, a plane of InAs or InGaAs quantum boxes 200 with a density of 400 boxes per µm$^2$ and emitting at close to $E_0$=1.29 eV at 77K, with a typical spectrum width σ=80 meV, is inserted at the heart of the structure. The number of boxes in this column is therefore close to N=310, and their distribution as a function of the energy is written as follows:

$$n(E)dE = 2N/\sigma\sqrt{\pi}\, e^{\frac{-4(E-E_0)^2}{\sigma^2}} dE$$

For a mode width ΔE of 1 meV (typical of the state of the art, see ref. (6)), it is found that the shift Δ must be equal to at least 60 meV so that an average of 0.5 boxes are coupled at mode M.

Therefore, for example, we will calculate the structure of microcavity 200 so as to adjust the energy of its fundamental mode to 1.23 eV. As described previously, in this case this microcavity 200 is made in a known manner in the form of a micro-column with mirrors made from GaAs/AlAs.

The structure is placed on a base 300 (Stirling cooler) that will keep its temperature at a set point close to 77K, for which a single quantum box is coupled to the fundamental mode M. A GaAs substrate 350 is placed between the base 300 and the micro-column. The structure is optically pumped by an impulse laser.

Figure 6:
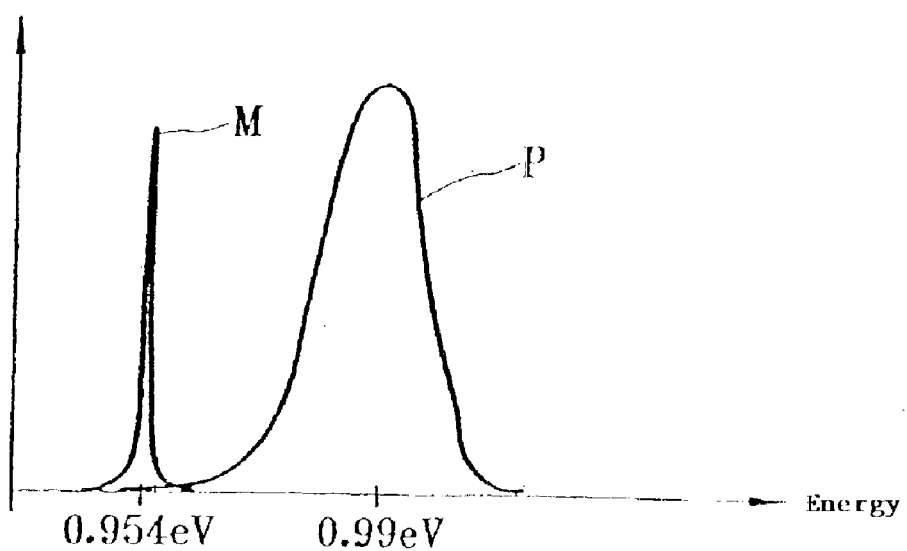
FIGS. 6 and 7 are plots showing the same elements as in FIGS. 4 and 5, but in the case of a source operating at a wavelength of 1.3 µm and 300 K.
Figure 7:
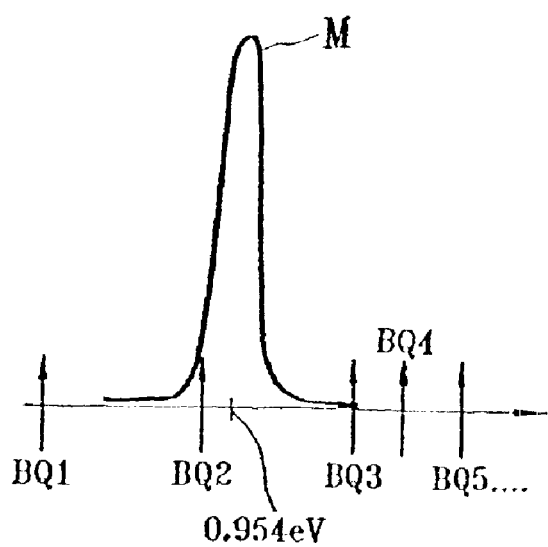

FIGS. 6 and 7 show the results obtained with a structure similar to that in FIG. 3 but adapted to an emission at a wavelength of 1.3 µm and at ambient temperature. The fundamental mode is at 0.954 eV (1.3 µm) at 300K; the plane of quantum boxes contains 400 boxes/µm$^2$, emits at close to 0.99 eV at 300K, and has a spectral width of 40 meV. It is easy to check that the average number of boxes 250 coupled to mode M is less than 0.5.

FIG. 7 more particularly shows a random distribution of boxes around mode M.

These FIGS. 6 and 7 show a mode density and an average spectral distribution of quantum boxes (FIG. 6) such that there is a large difference between M and P, and an example of a particular embodiment of the random distribution of boxes (FIG. 7).

Figure 8:
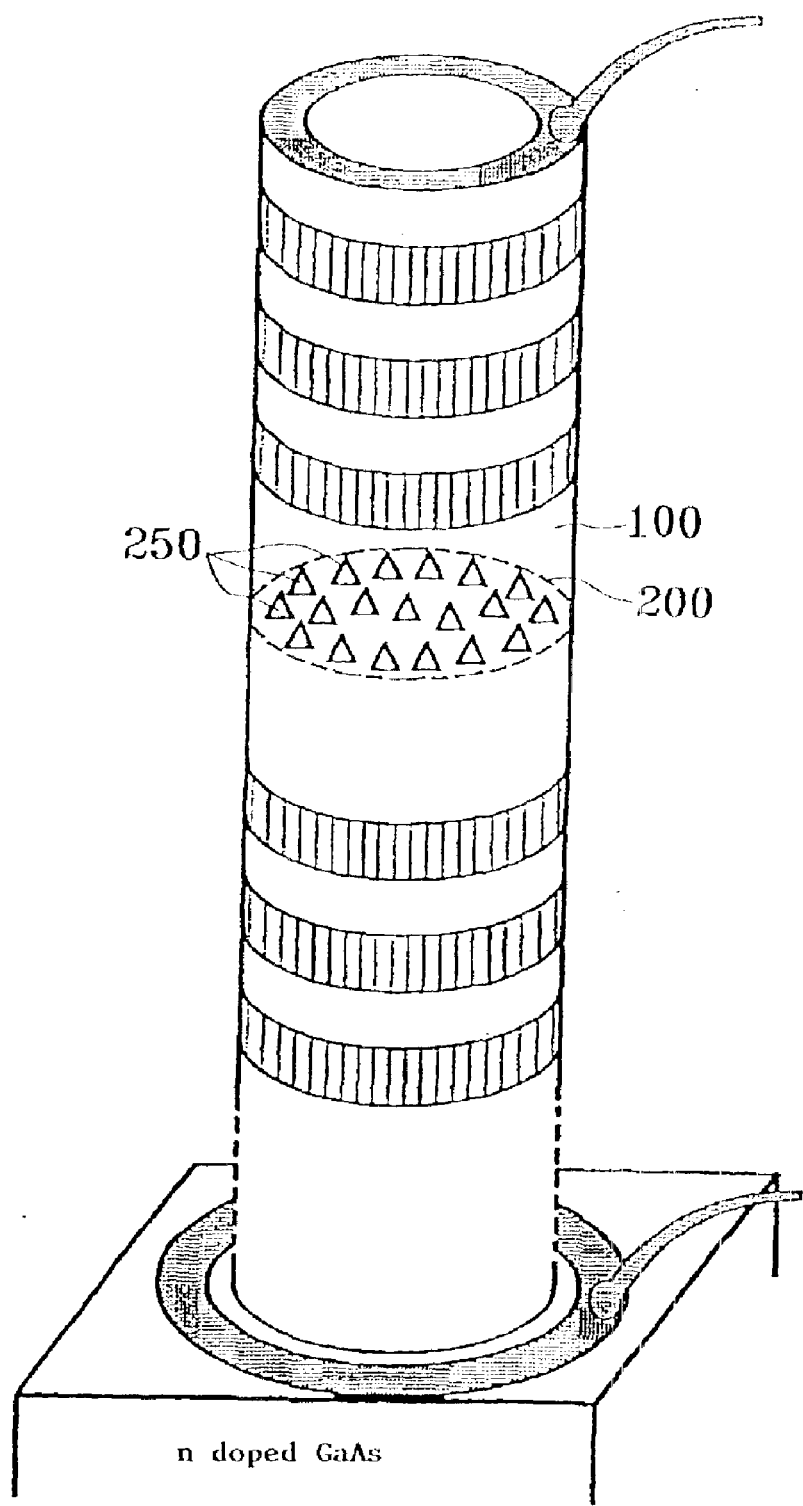
FIG. 8 shows a source according to the invention, designed to operate under electrical impulse excitation.

The structure in FIG. 8 corresponds to a structure similar to that in FIG. 3, except that the mirrors of the micro-column are doped and in electrical contact with the ends of the column by an electrical pulse generator, so as to achieve electrical excitation of the system.

In this case, the upper Bragg mirror is composed of alternating layers of p doped GaAs/AlAs and the lower mirror is composed of alternating layers of n doped GaAs/AlAs. The layer 100 forming the cavity is made of GaAs that is not intentionally doped. The micro-column is located on an n doped GaAs substrate.

Figure 9:
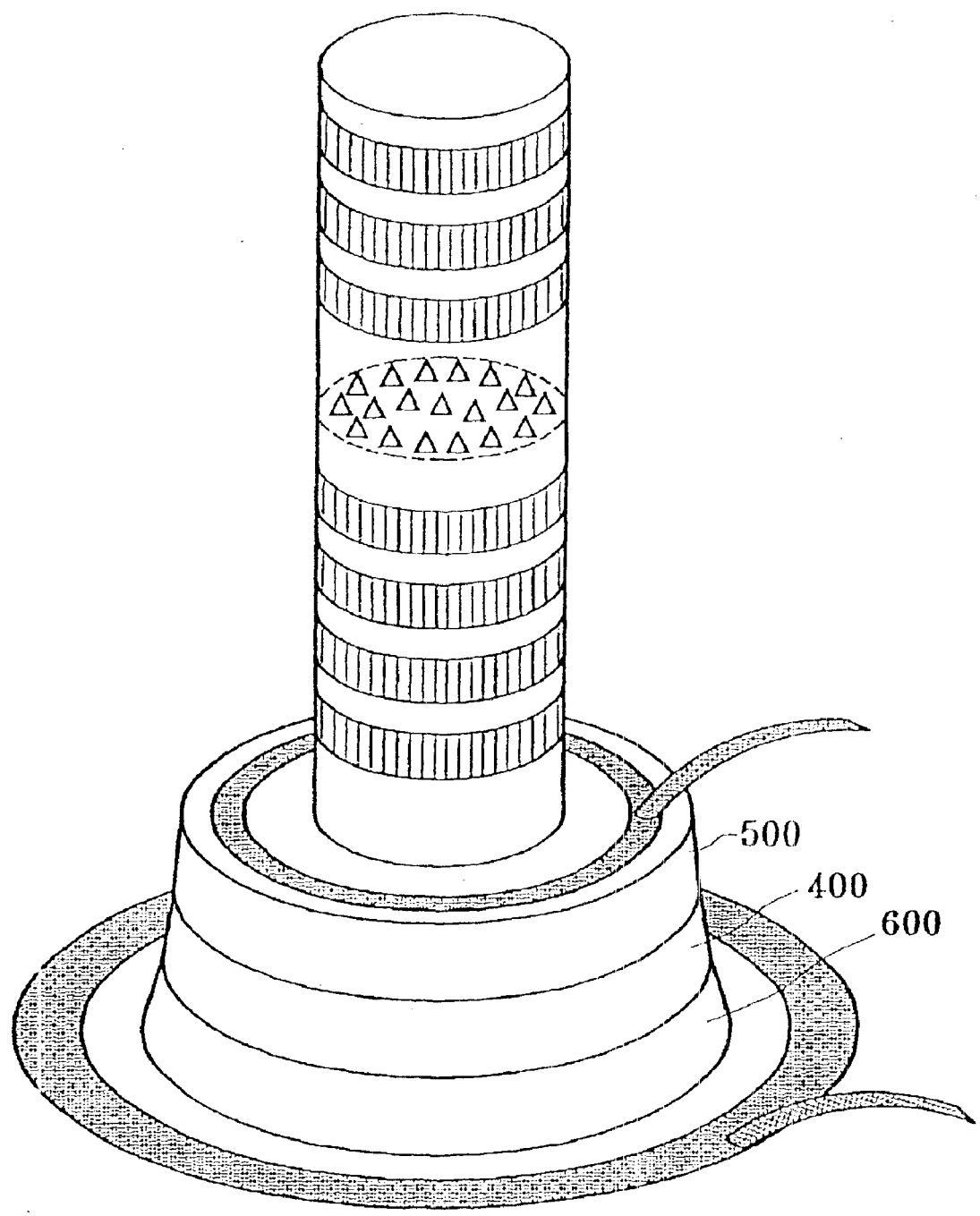
FIG. 9 shows a source according to the invention, with optical excitation by a surface emission laser.

FIG. 9 shows a structure identical to the structure in FIG. 3, except that it is monolithically integrated into a semiconducting surface emission microlaser.

The micro-column forms a single photon source with wavelength $\lambda$ and the microlaser forms a source at wavelength $\lambda'$, where $\lambda'$ is less than $\lambda$. The microlaser is composed of three layers, in other words one active layer 400 sandwiched between two Bragg mirrors 500 and 600, the first at the micro-column end being p doped, and the second at the end opposite to the micro-column being n doped. There are electrodes in contact with the two ends of the microlaser, one of the two electrodes surrounding the bottom of the micro-column.

Figure 10:
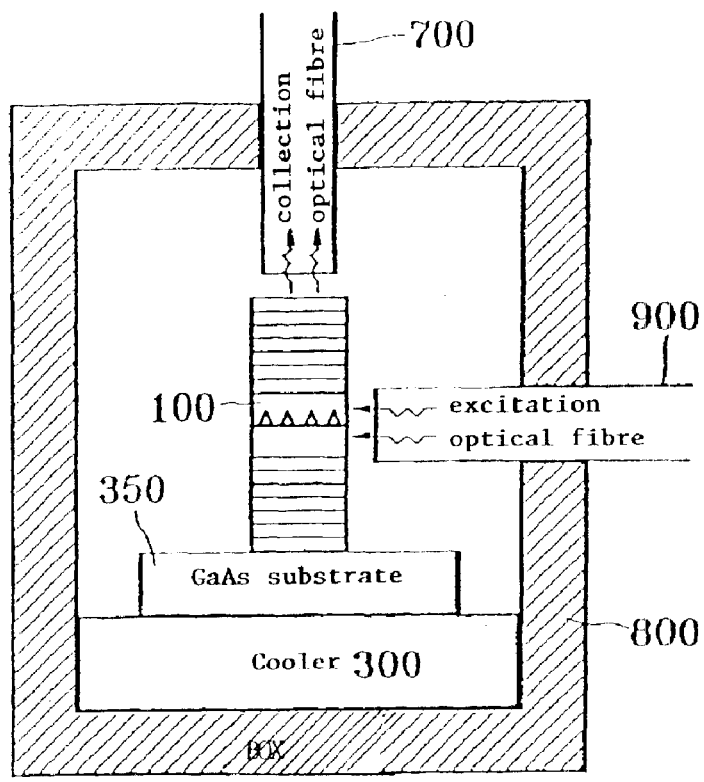
FIGS. 10 and 11 each show a source similar to that in FIG. 3, optically pumped for FIG. 10, and electrically pumped for FIG. 11, and in both cases coupled to an optical fibre for collection of the emitted photons.
Figure 11:
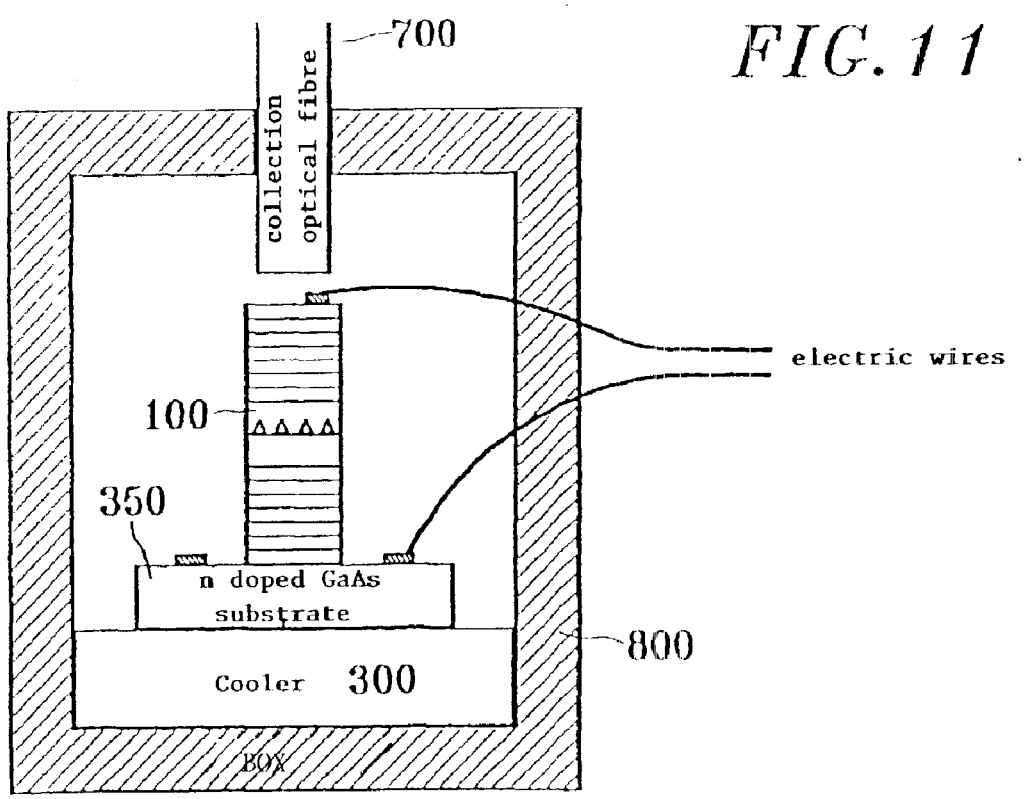

FIGS. 10 and 11 show a structure identical to the structure in FIG. 3, coupled to an optical fibre 700 for the collection of emitted photons and electrically pumped (FIG. 11) or optically pumped by an optical fibre (FIG. 10).

In these two examples, the structure in FIG. 3 with its cooler 300 and its substrate 350 is placed in a box 800 and the collection optical fibre 700 passes through the box 800 from an upper end of the micro-column.

In the case shown in FIG. 11, the excitation electrodes are placed in the same way as in FIG. 8.

In the case shown in FIG. 11, an excitation optical fibre 900 passes through the box laterally to excite the cavity 100 of the micro-column.

Figure 12:
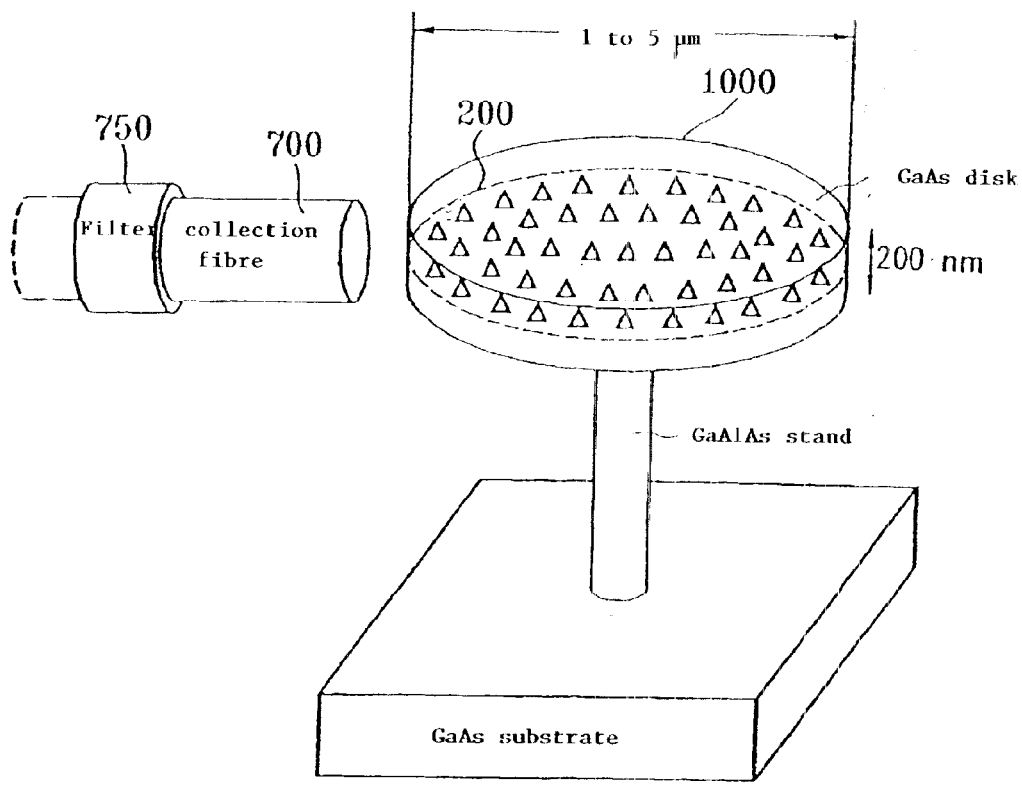
FIG. 12 shows a source according to the invention, made from a micro-disk based on GaAs and GaAlAs.

FIG. 12 shows a micro-disk 1 000 based on GaAs and GaAlAs containing a plane of quantum boxes 200 made of InGaAs.

This micro-disk 1000 is placed on an elongated base made of GaAlAs, itself placed on a GaAs substrate.

Figure 13:
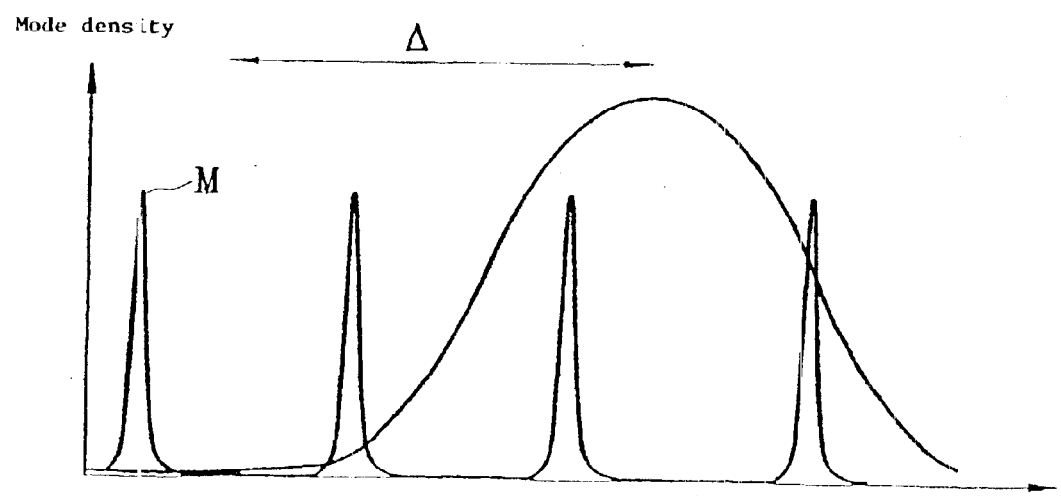
FIG. 13 is a plot showing a distribution of the density of quantum box modes compared with a cavity mode in the case of the micro-disk shown in FIG. 12.

The thickness of the micro-disk is of the order of 200 nm, and the disk diameter (1 to 5 $\mu$m) is adjusted such that one of its confined modes, mode M in FIG. 13, is sufficiently offset from the mean emission of all the quantum boxes, in other words the concentration point of the frequencies of quantum boxes 250, and on average is coupled to a small number of boxes (0.1 to 0.5).

An optical fibre 700 (or a semiconductor wave guide) collects emitted photons. A pass band filter 750 is used to select photons emitted in mode M from the parasite emission emitted in the other modes. In one particular embodiment, this filter 750 may be integrated into the fibre as shown in FIG. 12.

Figure 14:
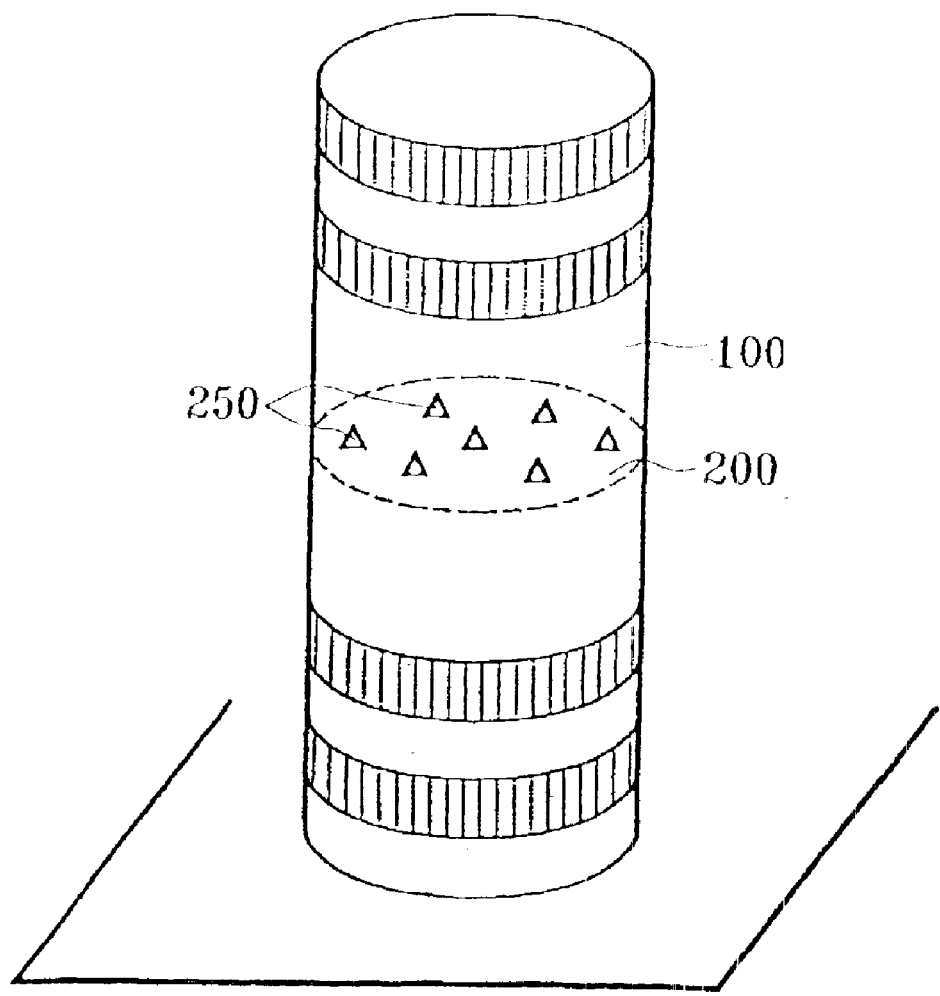
FIG. 14 shows an SiO2/Ta$_2$O$_5$ Bragg mirror type source according to the invention.

FIG. 14 shows a cylindrical micro-column with an elliptical section composed of a cavity layer 100 made of GaN or GaAlN containing a plane of InGaN quantum boxes 200, and dielectric Bragg mirrors (for example based on SiO2 and Ta2O5) on each side of the layer 100. The lower Bragg mirror may also be made based on a stack of GaN and GaAlN layers. In one variant, the quantum boxes are made of GaN and the cavity layer is made of GaAlN.

An emission wavelength in the visible range (particularly blue and green) or the near ultraviolet can be chosen for this single photon source, by varying the composition and size of the InGaN or GaN quantum boxes.

In this case, and less essentially, it is possible to:

1) add a system to stabilize and adjust the temperature;
2) add a system to collect single photons (fibre, guide, etc.);
3) add a system for spectral filtering of the parasite emission of quantum boxes not coupled to the mode;
4) integrate means of optical or electrical impulse pumping of quantum boxes in the microcavity.

There are preferred embodiments, for example corresponding to one of the different variants in the appended figures, in which we preferably adopt the following, for a particularly easy and reliable embodiment:

quantum boxes made of a material with formula $In_xGa_{1-x}As$, where x is between 0.5 and 1;

the cavity layer made of $Ga_yAl_{1-y}As$ where y is between 0.5 and 1, particularly in the case of quantum boxes according to the previous paragraph;

quantum boxes made of InAs and the cavity layer made of GaAs (a particularly good choice);

in one variant, the quantum boxes are made of $In_xGa_{1-x}N$, where x is between 0 and 1.

(1) A. Imamoglu and Y. Yamamoto, Phys. Rev. Lett. 72, 210, 1994; J. Kim et al., Nature, 397, 500, 1999

(2) J. M. Gérard, B. Gayral in<<QUED phenomena and applications of microcavities and photonic crystals>>H. Benisty, J. M. Gérard, J. Rarity and C. Weisbuch publishers, Springer-Verlag, Berlin 1999; J. M. Gérard and B. Gayral, J. Lightwawe Technol. 17, 2089 (1999)

(3) B. Gayral, J. M. Gérard, A. Lemaître, C. Dupuis, L. Manin and J. L. Pelouard, Appl. Phys. Lett. 75, 1908 (1999); J. M. Gérard, B. Sermage, B. Gayral, B. Legrand, E. Costard, V. Thierry-Mieg Phys. Rev. Lett 81, 1110 (1998)

(4) M. Yamanishi and Y. Yamamoto, J.J.A.P. 30, L60, 1991; and Oliver Benson et al. Phys. Rev. Let. 84, 2513, 2000

(5) J. M. Gérard, B. Gayral in<<CQED phenomena and applications of microcavities and photonic crystals>>H. Benisty, J. M. Gérard, J. Rarity and C. Weisbuch publishers, Springer-Verlag 1999; J. M. Gérard and B. Gayral, J. Lightwawe Technol. 17, 2089 (1999)

(6) B. Gayral et al. Appl. Phys. Lett. 72, 1421, 1998

What is claimed is:

1. Opto-electronic component capable of emitting light pulses containing a single photon, opto-electronic comprising:

a resonant optics cavity (100) and a group of photon emitters (250) placed in this optical cavity (100), a single one of these emitters (250) having an emission frequency equal to approximately the resonant frequency (M) of the cavity (100), wherein all emitters have a spectral distribution with a concentration of frequencies of emitters (250) at a given frequency (P), and wherein the cavity (100) is made so that its resonant frequency (M) is sufficiently different from this concentration frequency (P) so that the number of emitters (250) with an emission frequency corresponding to the resonant frequency (M) of the cavity (100) is close to one.

2. Component according to claim 1, characterised in that the emitters (250) are generated from one or more semiconductor materials.

3. Component according to claim 2, wherein the emitters (250) are semiconducting quantum boxes.

4. Component according to claim 3, wherein the quantum boxes are made of $In_xGa_{1-x}As$, where x is between 0.5 and 1.

5. Component according to claim 4, wherein the cavity is composed of a $Ga_yAl_{1-y}As$ layer, where y is between 0.5 and 1.

6. Component according to claims 4 and 5 in combination, wherein x=1 and y=1.

7. Component according to claim 1, wherein component's mode spectral density of the emitters (250) at the frequency of the cavity mode (M) is close to 0.5 emitters for the width of the cavity mode (M).

8. Component according to claim 1, wherein the component includes means of adjusting emission frequencies of emitters such that the frequency of a single emitter corresponds to the resonant frequency of the cavity.

9. Component according to claim 1, wherein the component includes a means (750) of filtering the photon(s) emitted at the frequency of the cavity mode (M) from photons of emitters not coupled to the cavity mode.

10. Component according to claim 1, wherein the component includes optical or electrical impulse pumping means (400, 500, 600, 900) of the emitters (250).

11. Component according to claim 1, wherein the component includes means (700) of collecting the emitted single photon pulses.

12. Component according to any one of claims 1 to 11 in combination with claim 3, wherein the quantum boxes are made of $In_xGa_{1-x}N$, where x is between 0 and 1.

* * * * *

UNITED STATES PATENT AND TRADEMARK OFFICE
CERTIFICATE OF CORRECTION

PATENT NO. : 6,868,103 B2
DATED : March 15, 2005
INVENTOR(S) : Gerard et al.

It is certified that error appears in the above-identified patent and that said Letters Patent is hereby corrected as shown below:

<u>Column 8,</u>
Line 45, before "opto-electronic" please insert -- the --.
Line 45, after "opto-electronic" please insert -- component --.

Signed and Sealed this

Twenty-third Day of August, 2005

JON W. DUDAS
*Director of the United States Patent and Trademark Office*